United States Patent
Park et al.

(10) Patent No.: US 8,847,270 B2
(45) Date of Patent: Sep. 30, 2014

(54) LED PACKAGE WITH RECESS AND PROTRUSIONS

(75) Inventors: Hun Yong Park, Gyeonggi-do (KR); Seong Deok Hwang, Seoul (KR); Won Ho Jung, Chungcheongnam-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 340 days.

(21) Appl. No.: 13/327,189

(22) Filed: Dec. 15, 2011

(65) Prior Publication Data

US 2012/0153334 A1 Jun. 21, 2012

(30) Foreign Application Priority Data

Dec. 17, 2010 (KR) .................. 10-2010-0130325

(51) Int. Cl.
*H01L 33/58* (2010.01)
*H01L 33/60* (2010.01)
*H01L 33/48* (2010.01)

(52) U.S. Cl.
CPC ....... *H01L 33/58* (2013.01); *H01L 2224/48091* (2013.01); *H01L 33/60* (2013.01); *H01L 33/486* (2013.01); *Y10S 362/80* (2013.01)
USPC .......... 257/99; 438/26; 257/98; 257/E33.073; 362/249.01; 362/800

(58) Field of Classification Search
USPC ............ 362/800, 249.01; 438/26; 257/98, 99, 257/E33.073
See application file for complete search history.

(56) References Cited

U.S. PATENT DOCUMENTS

| | | | |
|---|---|---|---|
| 7,427,806 B2 | 9/2008 | Arndt et al. | |
| 7,830,079 B2 | 11/2010 | Tamaki et al. | |
| 2006/0022215 A1* | 2/2006 | Arndt et al. | 257/99 |
| 2007/0090382 A1 | 4/2007 | Ryu | |
| 2007/0247841 A1* | 10/2007 | Kono et al. | 362/227 |
| 2009/0091045 A1* | 4/2009 | Tanikawa et al. | 257/791 |
| 2010/0123159 A1* | 5/2010 | Song et al. | 257/99 |
| 2010/0171139 A1* | 7/2010 | Muranaka et al. | 257/98 |

FOREIGN PATENT DOCUMENTS

| | | |
|---|---|---|
| CN | 101071838 A | 11/2007 |
| CN | 201307605 Y | 9/2009 |
| JP | 2009-24606 | 10/2009 |
| KR | 10-2008-0058645 A | 6/2008 |

OTHER PUBLICATIONS

Chinese Office Action issued in Chinese Application No. 2011104365538 dated Dec. 30, 2013, with English translation, 14 pgs.

* cited by examiner

*Primary Examiner* — Michael Jung
*Assistant Examiner* — John P Dulka
(74) *Attorney, Agent, or Firm* — McDermott Will & Emery LLP

(57) ABSTRACT

A light emitting diode (LED) package is provided. The LED package includes an LED, a plurality of lead frames electrically connected with the LED, a package body having a receiving groove exposed to receive the LED therein and including a plurality of supporting units provided to project from an inner side surface of the receiving groove, and a filling member having an engaging groove engaged with the supporting unit at a circumference of a side surface thereof, and included inside the receiving groove.

10 Claims, 6 Drawing Sheets

US 8,847,270 B2

LED PACKAGE WITH RECESS AND PROTRUSIONS

CROSS-REFERENCE TO RELATED APPLICATIONS

This application claims the priority of Korean Patent Application No. 10-2010-0130325 filed on Dec. 17, 2010, in the Korean Intellectual Property Office, the disclosure of which is incorporated herein by reference.

BACKGROUND OF THE INVENTION

1. Field of the Invention

The present invention relates to a light emitting diode (LED) package.

2. Description of the Related Art

In realizing a package structure including an LED therein, according to the related art, a structure in which a cavity having a cup-like structure is formed in a package body made of a highly reflective material in order to reduce the loss of light emitted from the LED, the LED is mounted in the cavity, and the cavity is filled with a silicon or epoxy polymer in the form of a gel having superior optical characteristics and thermal resistance has been generally used.

This package structure according to the related art may have quality defects, such as the detachment of the LED due to the thermal deformation of the package body, and a delamination phenomenon caused in an interface between a filling member in the cavity and the package body, when the package structure is used in the rigorous condition of high temperature.

SUMMARY OF THE INVENTION

An aspect of the present invention provides a light emitting diode (LED) package having improved reliability by preventing a filling member sealing an LED from being easily separated from a package body.

An aspect of the present invention also provides an LED package capable of minimizing the thermal deformation of the package body and the filling member to thereby prevent the damage of the LED or the like.

According to an aspect of the present invention, there is provided a light emitting diode (LED) package, including: an LED; a plurality of lead frames electrically connected with the LED; a package body having a receiving groove exposed to receive the LED therein and including a plurality of supporting units provided to project from an inner side surface of the receiving groove; and a filling member having an engaging groove engaged with the supporting unit at a circumference of a side surface thereof, and included inside the receiving groove; wherein the supporting unit has a structure extended from a bottom surface of the receiving groove towards an upper surface of the package body, which is exposed by a formation of the receiving groove.

The supporting part may include an inclination surface projecting from the inner side surface of the receiving groove and facing the LED, and a pair of side surfaces connecting the inclination surface with the inner side surface.

The inclination surface may be formed to have a flat plane shape or a smoothly curved surface shape.

The inclination surface may have an asymmetrical structure in which a width thereof gradually decreases or increases towards the upper surface of the package body from the bottom surface of the receiving groove.

The inclination surface may have asymmetrical structure in which a width thereof at the bottom surface of the receiving groove is equal to a width thereof at the upper surface of the package body.

The side surface may have an asymmetrical structure, in which, in a length thereof projecting from the inner side surface of the receiving groove, the length thereof at the bottom surface of the receiving groove is different from the length thereof at the upper surface of the package body.

The side surface may have a structure in which the projecting length thereof gradually decreases towards the upper surface of the package body from the bottom surface of the receiving groove.

The side surface may have a structure in which the projecting length thereof gradually increases towards the upper surface of the package body from the bottom surface of the receiving groove.

The side surface may have a symmetrical structure, in which, in a length thereof projecting from the inner side surface of the receiving groove, the length thereof at the bottom surface of the receiving groove is identical to the length thereof at the upper surface of the package body.

The supporting unit may include a plurality of supporting units, and the plurality of supporting units may have a symmetrical structure in which they are spaced apart from each other along the inner side surface of the receiving groove and face each other.

The supporting unit may include a plurality of supporting units, and the plurality of supporting units may have an asymmetrical structure in which they are spaced apart at different distances along the inner side surface of the receiving groove.

The engaging groove of the filling member may be included at a location of the filling member corresponding to the supporting unit, and may have a shape corresponding to the supporting unit.

The filling member may contain a dispersion material or a fluorescent substance therein.

The filling member may be provided to have a height lower than that of the upper surface of the package body.

The LED package may further include a lens unit provided on the filling member.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
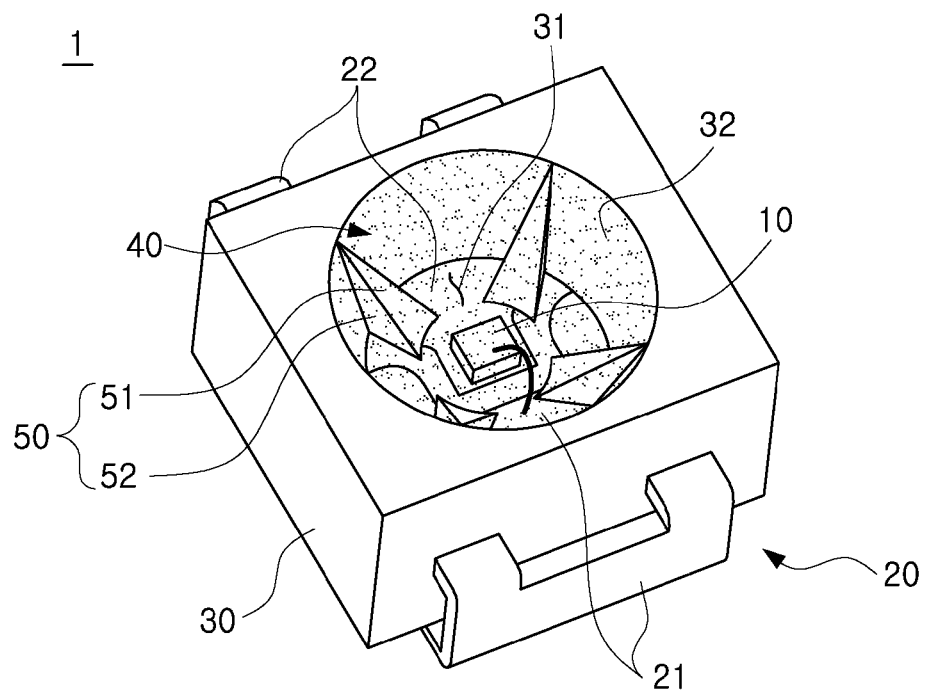
FIG. 1 is a schematic perspective view of an LED package according to an exemplary embodiment of the present invention.

A light emitting diode (LED) according to an exemplary embodiment of the present invention will now be described in detail with reference to the accompanying drawings. The invention may, however, be embodied in many different forms and should not be construed as being limited to the embodiment set forth herein. Rather, this embodiment is provided so that this disclosure will be thorough and complete, and will fully convey the scope of the invention to those skilled in the art.

In the drawings, the shape and the size of components shown in drawings are exaggerated for clarity. The same or equivalent elements are referred to by the same reference numerals throughout the specification.

An LED package according to an exemplary embodiment of the present invention will be explained with reference to FIGS. 1 through 3.

Figure 2:
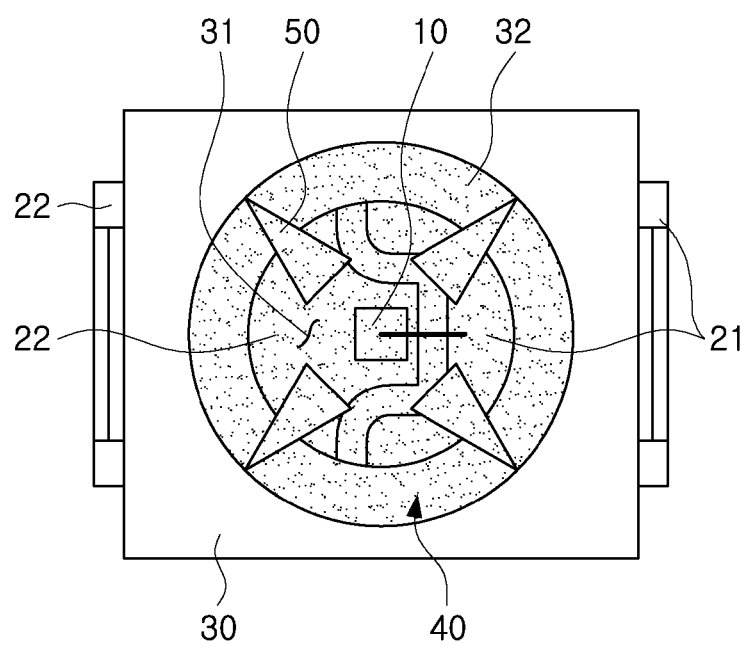
FIG. 2 is a schematic plan view of the LED package of FIG. 1.
Figure 3A:
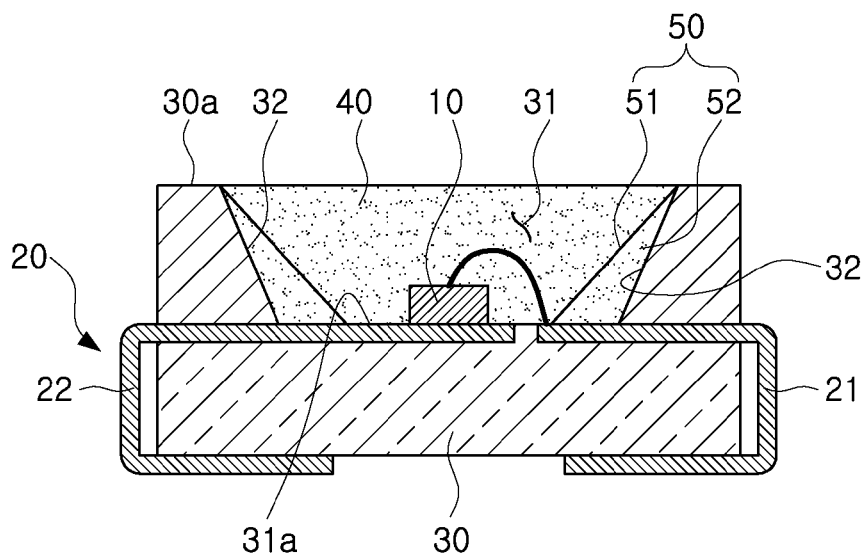
FIG. 3A is a schematic cross sectional view of the LED package of FIG. 1.
Figure 3B:
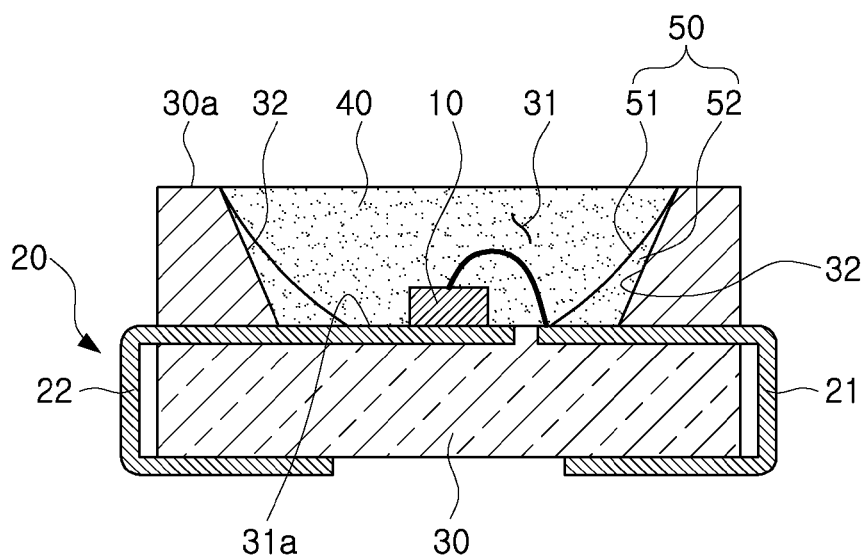
FIG. 3B is a schematic cross sectional view of a modified embodiment of a supporting unit shown in FIG. 3A.
Figure 4:
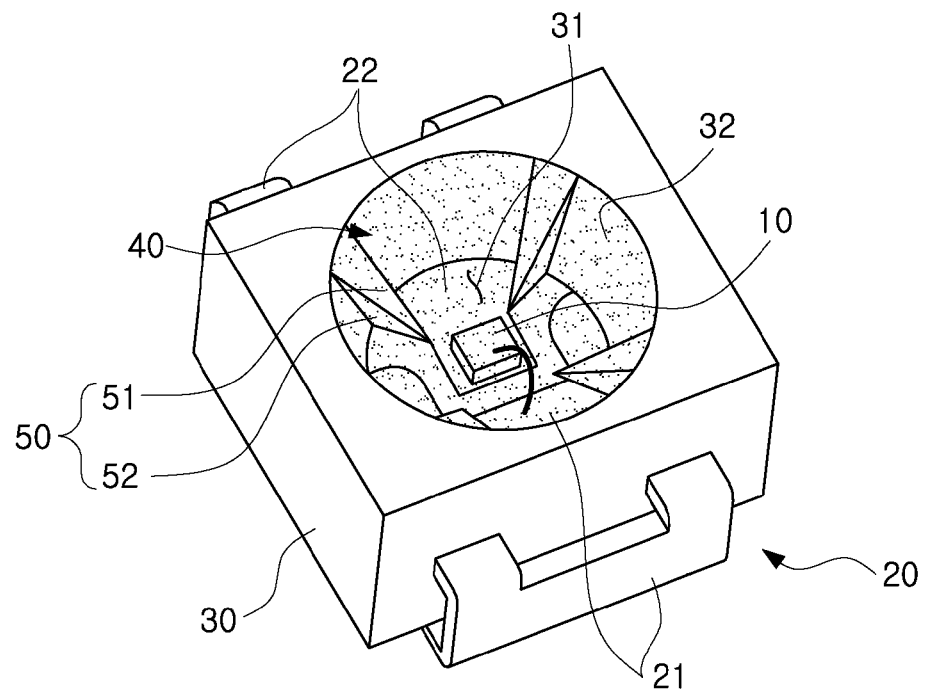
FIGS. 4 through 7 are diagrams schematically showing LED packages according to various embodiments of a supporting unit in the LED package of FIG. 1.

FIG. 1 is a schematic perspective view of an LED package according to an exemplary embodiment of the present invention. FIG. 2 is a schematic plan view of the LED package of FIG. 1. FIG. 3A is a schematic cross sectional view of the LED package of FIG. 1. FIG. 3B is a schematic cross sectional view of a modified embodiment of a supporting unit shown in FIG. 3A.

Referring to FIG. 1, an LED package 1 according to an exemplary embodiment of the present invention may include a light emitting diode (LED) 10, a lead frame 20, a package body 30, and a filling member 40, and may further include a lens unit 60 provided on the filling member 40.

The LED 10 is a kind of semiconductor device emitting light of a predetermined wavelength through the application of external power, and may be provided alone or in plural.

The lead frame 20 may include a plurality of lead frames, such as first and second lead frames 21 and 22, and the plurality of lead frames may be disposed to be spaced apart from each other in such a manner that they are electrically separated from each other. One side of the lead frame 20, for example, the second lead frame 22, may have the LED 10 mounted thereon and may be electrically connected to the first lead frame 21 through a bonding wire. Although not shown in drawings, the second lead frame 22 may be electrically connected to the first lead frame 21 by a flip chip bonding method through the use of solder.

The package body 30 may be formed of a plastic, a resin, or a ceramic material, and may include a receiving groove 31 of which an upper surface is exposed, to thereby receive the LED 10 therein. In addition, the package body 30 may include a plurality of supporting units 50 formed along the circumference of an inner side surface 32 of the receiving groove 31, each supporting unit 50 projecting from the inner side surface 32 of the receiving groove 31.

The receiving groove 31 may have a tapering structure in which the inner side surface 32 is inclined in such a manner that an opening of an upper portion thereof is greater than that of a lower portion thereof in size, in order to evenly emit and diffuse light generated from the LED 10 received in the receiving groove 31.

Meanwhile, FIGS. 4 through 7 are diagrams schematically showing LED packages according to various embodiments of a supporting unit in the LED package of FIG. 1. The supporting unit will be explained in detail with reference to FIGS. 1 through 7.

As shown in FIGS. 1 through 7, the supporting unit 50 may have a structure extended from a bottom surface 31A of the receiving groove 31 towards an upper surface 30A of the package body 30, the upper surface 30A of the package is being exposed by the formation of the receiving groove 31. Specifically, the supporting part 51 may include an inclination surface 51 projecting from the inner side surface 32 of the receiving groove 31 and facing the LED 10, and a pair of side surfaces 52 connecting the inclination surface 51 with the inner side surface 32.

Figure 5:
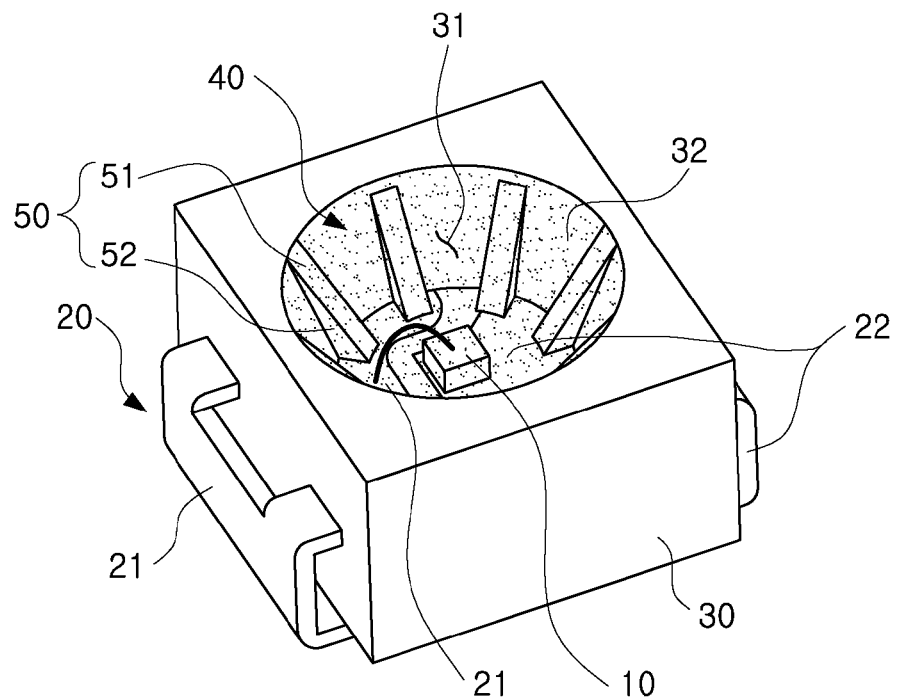

The inclination surface 51, as shown in FIG. 3A, may be formed to have an entirely flat plane shape along the length direction thereof extended from the bottom surface 31A of the receiving groove 31 towards the upper surface 30A of the package body 30, or may be formed to have a smoothly curved surface as depicted in FIG. 3B. Also, as shown in FIGS. 1 through 4, the inclined surface 51 may have a horizontally asymmetrical structure (for example, a triangular shape) in which a width thereof gradually decreases or increases towards the upper surface 30A of the package body 30 from the bottom surface 31A of the receiving groove 31. Furthermore, as shown in FIG. 5, the inclination surface 51 may have a symmetrical structure (for example, a quadrilateral shape) in which a width thereof at the bottom surface 31A of the receiving groove 31 is equal to a width thereof at the upper surface 30A of the package body 30.

Figure 6A:
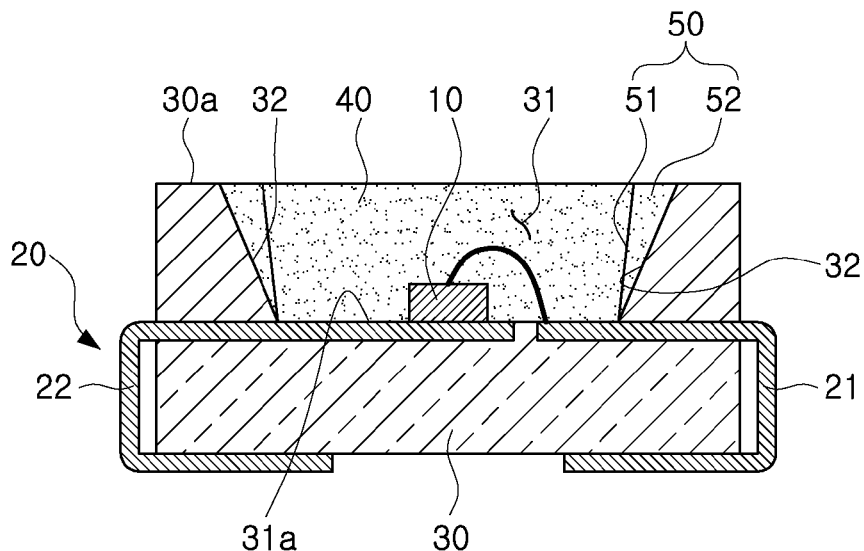
Figure 6B:
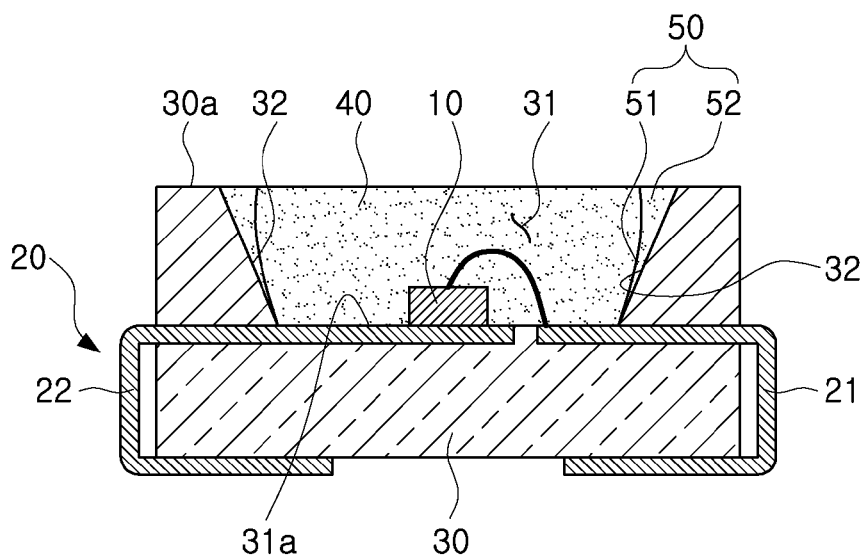

Meanwhile, the supporting unit 50 may have an asymmetrical structure, in which, in a thickness thereof projecting from the inner side surface 32 of the receiving groove 31, in particular, the length of the side surface 52 projecting from the inner side surface 32 of the receiving groove 31, a length of the side surface 52 at the bottom surface 31A of the receiving groove 31 is different in size from a length thereof at the upper surface 30A of the package body 30. For example, as shown in FIGS. 1 through 5, the side surface 52 may have a structure in which the projecting length thereof gradually decreases towards the upper surface 30A of the package body 30 from the bottom surface 31A of the receiving groove 31. On the contrary, as shown in FIG. 6, the side surface 52 may have a structure in which the projecting length thereof gradually increases towards the upper surface 30A of the package body 30 from the bottom surface 31A of the receiving groove 31.

Figure 7:
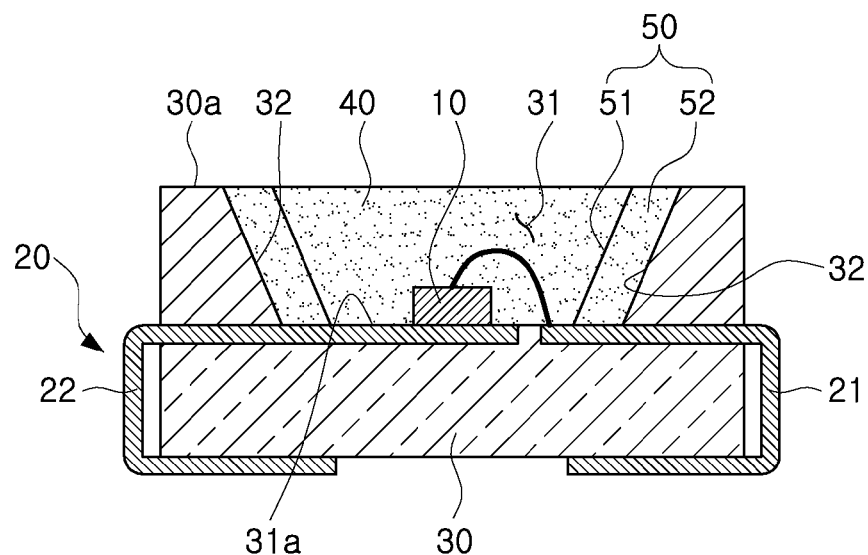
Figure 8:
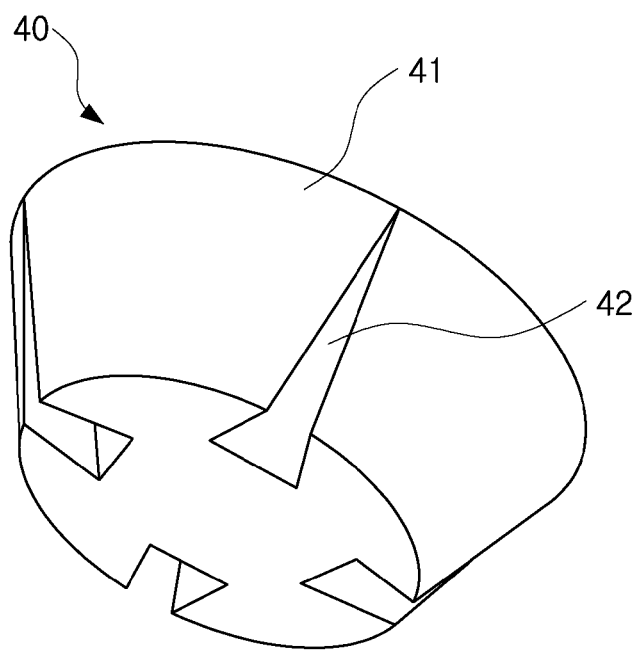
FIG. 8 is a schematic perspective view of a filling member in the LED package of FIG. 1.

Moreover, as shown in FIG. 7, the side surface 52 may have a symmetrical structure, in which, in the length thereof projecting from the inner side surface 32 of the receiving groove 31, the length thereof at the bottom surface 31A of the receiving groove 31 is identical to the length thereof at the upper surface 30A of the package body 30.

This supporting unit 50 may include a plurality of supporting units 50, and the plurality of supporting units 50 may have a symmetrical structure in which they are spaced apart from each other along the inner side surface 32 of the receiving groove 31 and face each other. However, the present invention is not limited thereto, and the plurality of supporting units 50 may have an asymmetrical structure in which they are spaced apart at different distances along the inner side surface 32 of the receiving groove 31. The arrangement structure and structural characteristics of this supporting unit 50 may be formed by various combinations in consideration of the filling member 40 filled in the receiving groove 31.

Meanwhile, the filling member 40 is included inside the receiving groove 31 so as to fill the receiving groove 31, and seals and protect the LED 10 therein. The filling member 40 may have a structure corresponding to the structure of the receiving groove 31, and may include an engaging groove 42 engaged with the supporting unit 50 at the circumference of a side surface 41 thereof, the side surface 41 being in contact with the inner side surface 32 of the receiving groove 31.

The engaging groove 42 of the filling member 40 is provided at a location in the circumference of a side surface 41, corresponding to the supporting unit 50. In addition, the filling member 40 may contain a dispersion material therein to diffuse light. Furthermore, the filling member 40 may contain a fluorescent substance therein to emit light of a desirable wavelength.

Figure 9:
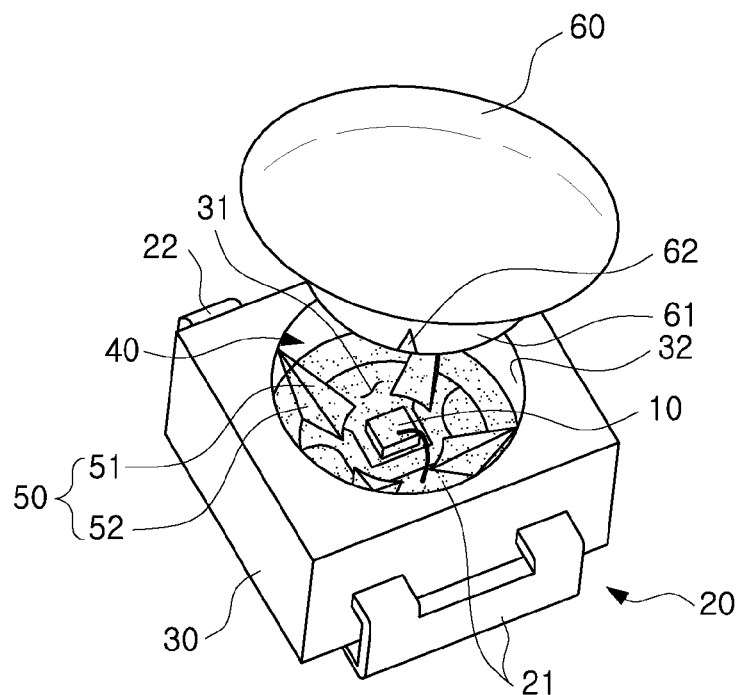
FIG. 9 is a schematic perspective view of an LED package including a lens unit and a modified embodiment of the filling member in the LED package of FIG. 1.
Figure 10:
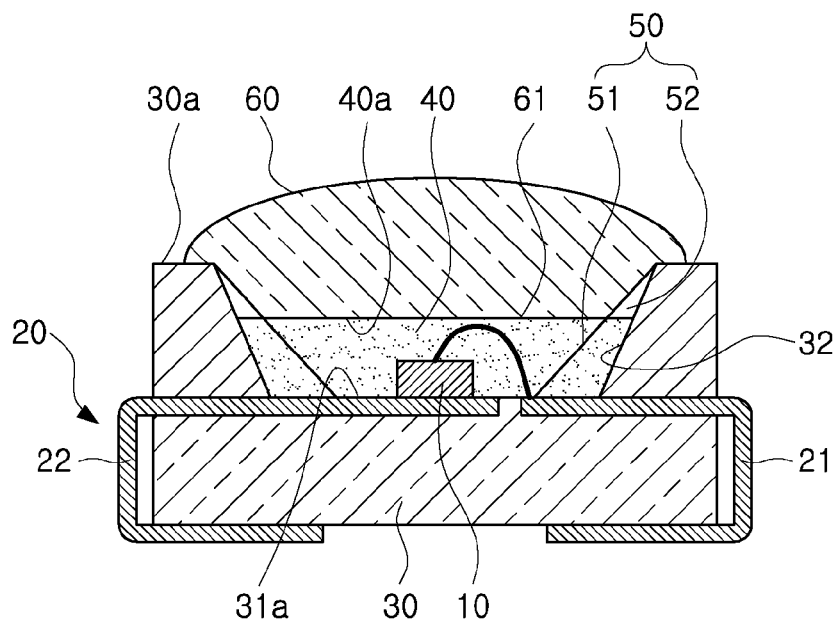
FIG. 10 is a cross sectional view of the LED package of FIG. 9.

The filling member 40 may be provided to have a height corresponding to the upper surface 30A of the package body 30 so as to fill the receiving groove 31. However, the present invention is not limited thereto, and the filling member 40 may protrude to have a height lower than that of the upper surface 30A of the package body 30 as shown in FIGS. 9 and 10. Although not illustrated, the filling member 40 may be provided to project to a height higher than that of the upper surface 30A of the package body 30.

The lens unit 60 may be included on the upper surface 40A of the filling member 40 or the upper surface 30A of the package body 30 including the filling member 40. The lens unit 60 may be formed on an upper portion of the filling member 40 by molding, or may be manufactured through a separate process to be attached to the upper portion of the filling member 40 through the use of an adhesive member.

As in FIGS. 9 and 10, in the case in which the filling member 40 is provided to have a height lower than the upper surface 30A of the package body 30, the lens unit 60 may further include a projecting unit 61 filling the space between the upper surface 40A of the filling member 40 and the upper surface 30A of the package body 30. In this case, the side surface of the projecting unit 61 may be provided with a receiving groove 62 which is coupled with the supporting unit 50 extended from the upper surface 40A of the filling member 40 to the upper surface 30A of the package body 30. Through this formation of the receiving groove 62, a coupling force between the lens unit 60 and the projecting unit 60 may be improved.

In this manner, the supporting unit 50 included inside the receiving groove 31 of the package body 30 may be provided along the inner side surface 32 of the receiving groove 31 in such a manner as to project therefrom, and may function as an axis supporting the receiving groove 31. Accordingly, even in the condition of high temperature, thermal stability in the package body 30 including the receiving groove 31 may be provided. In addition, bonding force between package body 30 and the filling member 40 filling the receiving groove 31 may be enhanced and the thermal deformation of the filling member 40 may be dispersed, thereby improving the reliability of the LED package.

As set forth above, according to exemplary embodiments of the invention, bonding force between the filling member and the package body could be improved to thereby prevent the filling member from being easily separated from the package body, whereby the LED package could have improved reliability. In addition, bonding force between the lens unit formed by additional molding and package body could be enhanced.

Also, the thermal deformation of the package body could be minimized, thereby preventing the damage of the LED and preventing deformation due to the thermal fatigue of the filling member.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode (LED) package, comprising:
an LED;
a plurality of lead frames electrically connected with the LED;
a package body having a receiving groove exposed to receive the LED therein and including a plurality of supporting units provided to project from an inner side surface of the receiving groove; and
a filling member having a plurality of engaging grooves corresponding to the plurality of supporting units, wherein the plurality of engaging grooves are located at a circumference of a side surface of the filling member and are engaged with each of the supporting units, respectively, when placed inside the receiving groove,
wherein each of the supporting units has a structure extending from a bottom surface of the receiving groove towards an upper surface of the package body, which is exposed by the receiving groove,
wherein each of the supporting units includes an inclination surface projecting from the inner side surface of the receiving groove and facing the LED, and a pair of side surfaces connecting the inclination surface with the inner side surface, and
wherein each side surface from the pair of side surfaces has an asymmetrical structure, in which, in a length thereof projecting from the inner side surface of the receiving groove, the length thereof at the bottom surface of the receiving groove is different from the length thereof at the upper surface of the package body, and
wherein each side surface from the pair of side surfaces has a structure in which the projecting length thereof gradually increases towards the upper surface of the package body from the bottom surface of the receiving groove.

2. The LED package of claim 1, wherein the inclination surface has a flat plane shape or a smoothly curved surface shape.

3. The LED package of claim 1, wherein the inclination surface has an asymmetrical structure in which a width thereof gradually decreases or increases towards the upper surface of the package body from the bottom surface of the receiving groove.

4. The LED package of claim 1, wherein the inclination surface has a symmetrical structure in which a width thereof at the bottom surface of the receiving groove is equal to a width thereof at the upper surface of the package body.

5. The LED package of claim 1, wherein the plurality of supporting units have a symmetrical structure in which they are spaced apart from each other along the inner side surface of the receiving groove and face each other.

6. The LED package of claim 1, wherein the plurality of supporting units have an asymmetrical structure in which they are spaced apart at different distances along the inner side surface of the receiving groove.

7. The LED package of claim 1, wherein each of the engaging grooves of the filling member is disposed at a location of the filling member corresponding to each of the supporting units, respectively, and has a shape corresponding to that of the supporting unit.

8. The LED package of claim 1, wherein the filling member contains a dispersion material and/or a fluorescent substance therein.

9. The LED package of claim 1, wherein the filling member has a height lower than that of the upper surface of the package body.

10. The LED package of claim 1, further comprising a lens unit provided on the filling member.

* * * * *